(12) United States Patent
Müller et al.

(10) Patent No.: US 9,835,513 B2
(45) Date of Patent: Dec. 5, 2017

(54) SENSOR MODULE FOR MEASURING A PRESSURE OF A FLUID WITH AT LEAST ONE ELECTRONIC CIRCUIT, PARTICULARLY AN INTEGRATED CIRCUIT, ARRANGED ON A CIRCUIT CARRIER, AND AT LEAST ONE PRESSURE MEASURING CHIP

(71) Applicant: Hella KGaA Hueck & Co., Lippstadt (DE)

(72) Inventors: Peter Müller, Jena (DE); Torsten Eggers, Bremen (DE)

(73) Assignee: HELLA KGAA HUECK & CO., Lippstadt (DE)

( * ) Notice: Subject to any disclaimer, the term of this patent is extended or adjusted under 35 U.S.C. 154(b) by 100 days.

(21) Appl. No.: 14/871,021

(22) Filed: Sep. 30, 2015

(65) Prior Publication Data

US 2016/0091384 A1 Mar. 31, 2016

(30) Foreign Application Priority Data

Sep. 30, 2014 (DE) ........................ 10 2014 014 103

(51) Int. Cl.
*G01L 19/00* (2006.01)
*G01L 19/04* (2006.01)
*G01L 19/14* (2006.01)

(52) U.S. Cl.
CPC ........ *G01L 19/141* (2013.01); *G01L 19/0069* (2013.01); *H01L 2224/48091* (2013.01)

(58) Field of Classification Search
CPC ......... G01L 19/00; G01L 19/04; G01L 19/14; G01L 19/141; G01L 19/0069; H01L 21/00; H01L 2224/48091
See application file for complete search history.

(56) References Cited

U.S. PATENT DOCUMENTS

| | | | |
|---|---|---|---|
| 6,229,190 B1 | 5/2001 | Bryzek et al. | |
| 8,101,469 B2 | 1/2012 | Kumar et al. | |
| 2001/0001550 A1* | 5/2001 | Bryzek ................. | B81B 3/0072 338/36 |
| 2005/0186703 A1* | 8/2005 | Weiblen ................ | B81B 7/0051 438/106 |

(Continued)

FOREIGN PATENT DOCUMENTS

| | | |
|---|---|---|
| DE | 19830805 A1 | 6/1999 |
| DE | 19929026 A1 | 12/2000 |

(Continued)

*Primary Examiner* — Nguyen Ha
(74) *Attorney, Agent, or Firm* — Muncy, Geissler, Olds & Lowe, P.C.

(57) ABSTRACT

In a sensor module for measuring a pressure of a fluid, having at least one supporting element, at least one electronic circuit, particularly an integrated circuit, arranged on at least one circuit carrier, and with at least one pressure measuring chip that has at least one pressure measuring membrane, wherein at least sections of the circuit carrier are surrounded by a protective material to protect it from surrounding fluids, it is provided as essential to the invention that the pressure measuring chip and the circuit carrier are arranged vertically one underneath the other, and that the pressure measuring chip is at least partially mechanically decoupled from the supporting element.

8 Claims, 5 Drawing Sheets

(56) References Cited

U.S. PATENT DOCUMENTS

Figure 5:
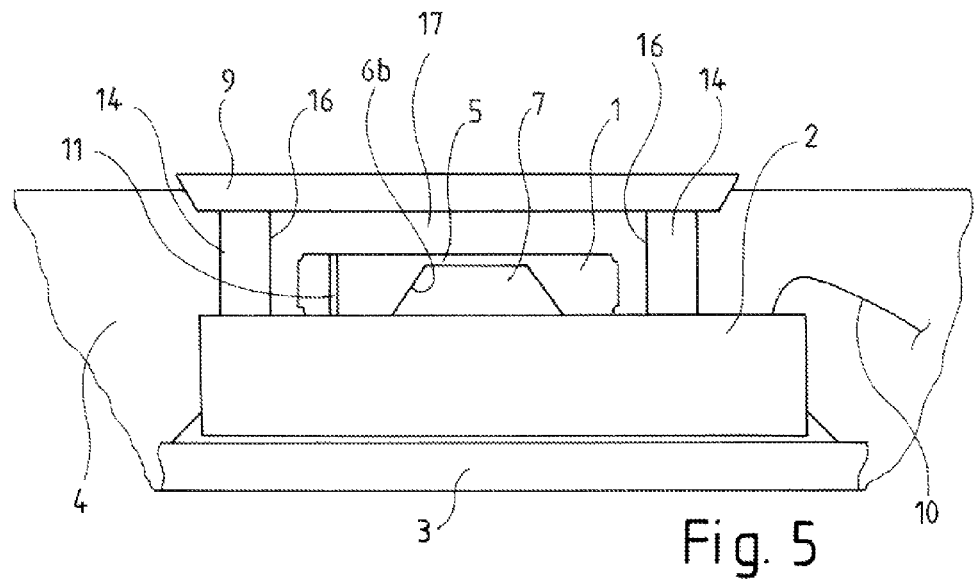

| | | | | |
|---|---|---|---|---|
| 2013/0093030 A1* | 4/2013 | Isebrand | ............... | H01L 23/055 257/415 |
| 2014/0342203 A1* | 11/2014 | Elian | .................. | G01L 19/0069 429/90 |
| 2015/0362391 A1* | 12/2015 | Suzuki | .................. | G01L 9/0044 137/511 |

FOREIGN PATENT DOCUMENTS

| | | | |
|---|---|---|---|
| DE | 102008017871 A1 | 11/2009 | |
| DE | 102013001159 A1 | 7/2014 | |

\* cited by examiner

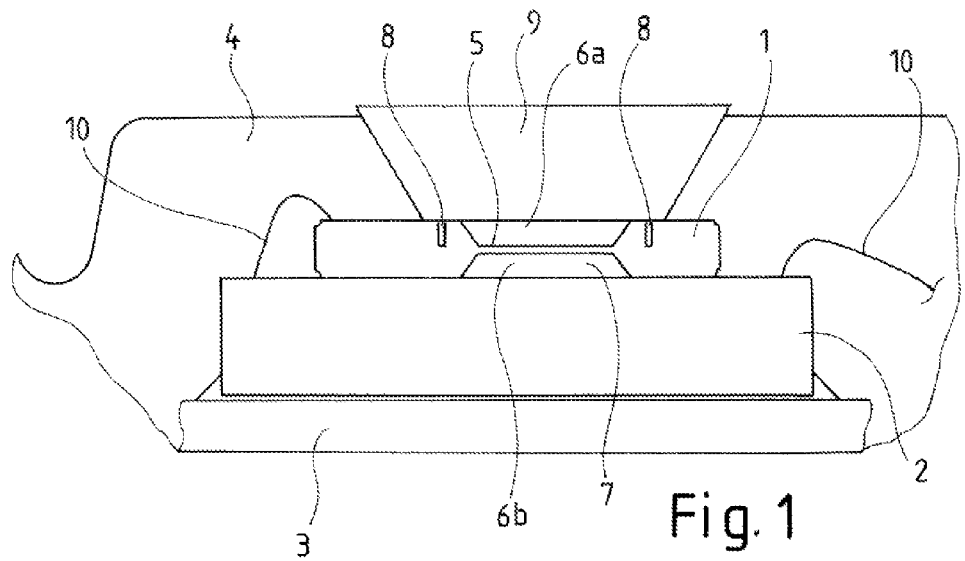
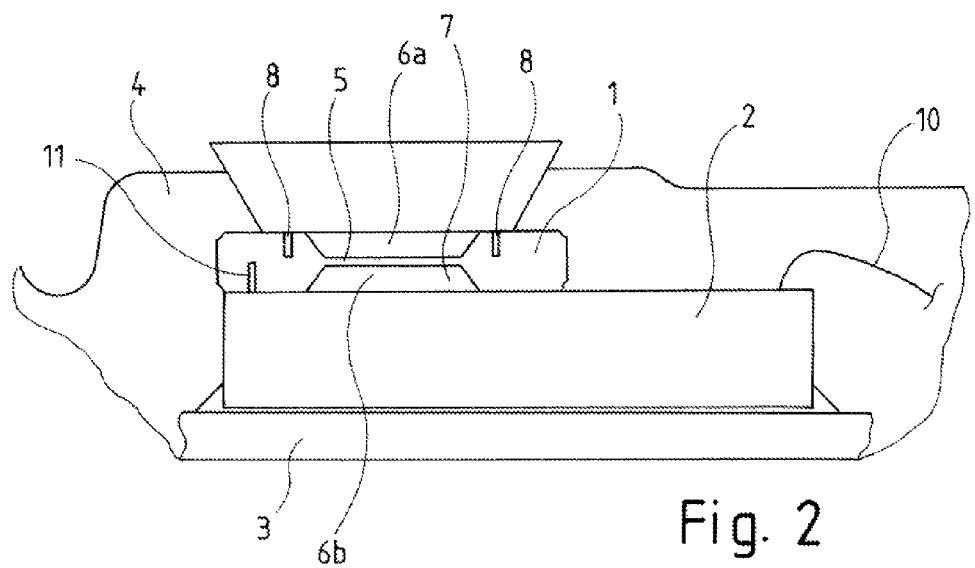

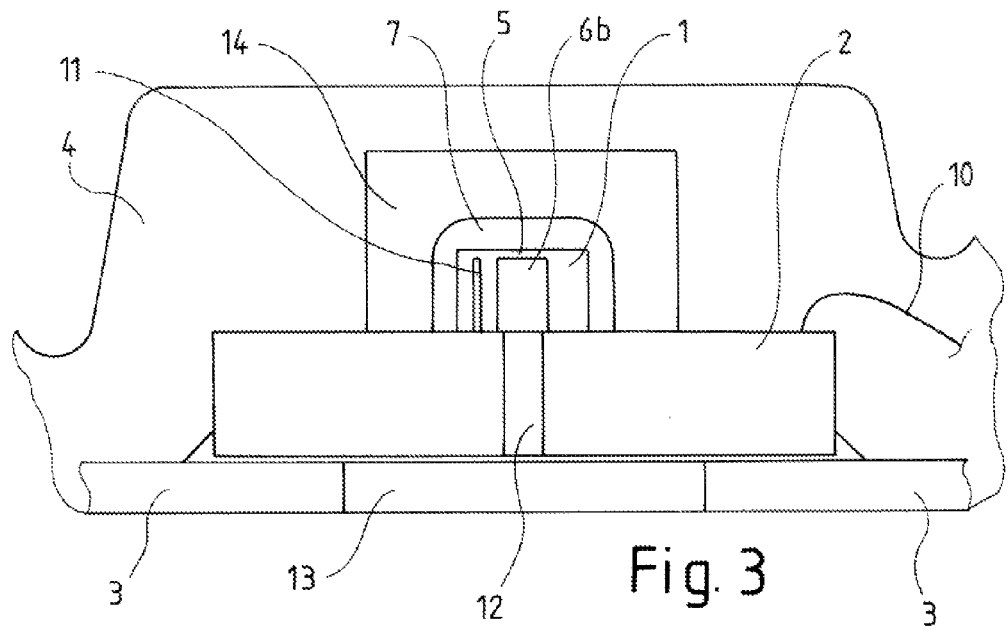
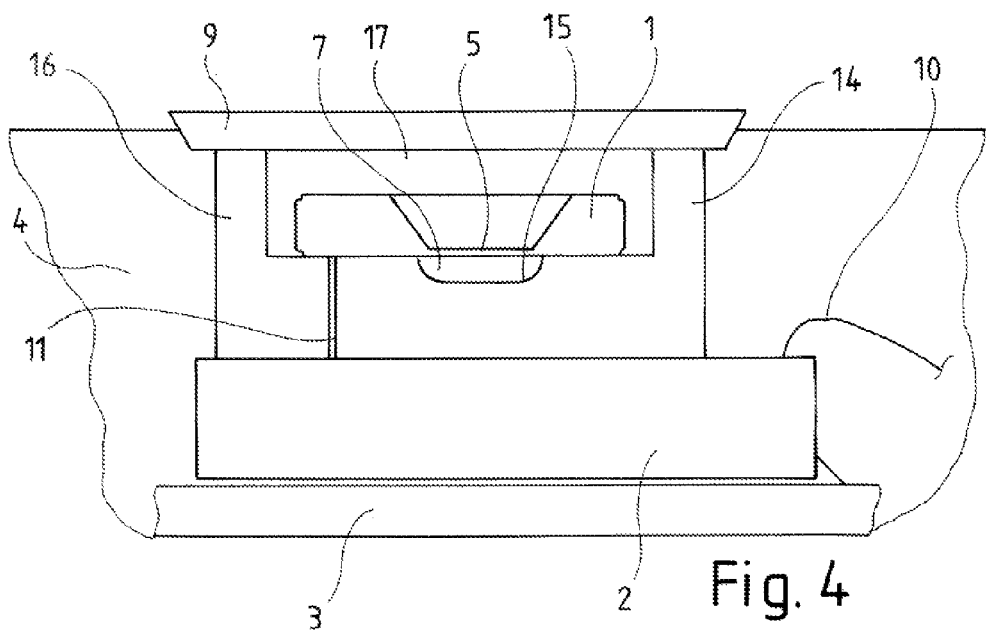

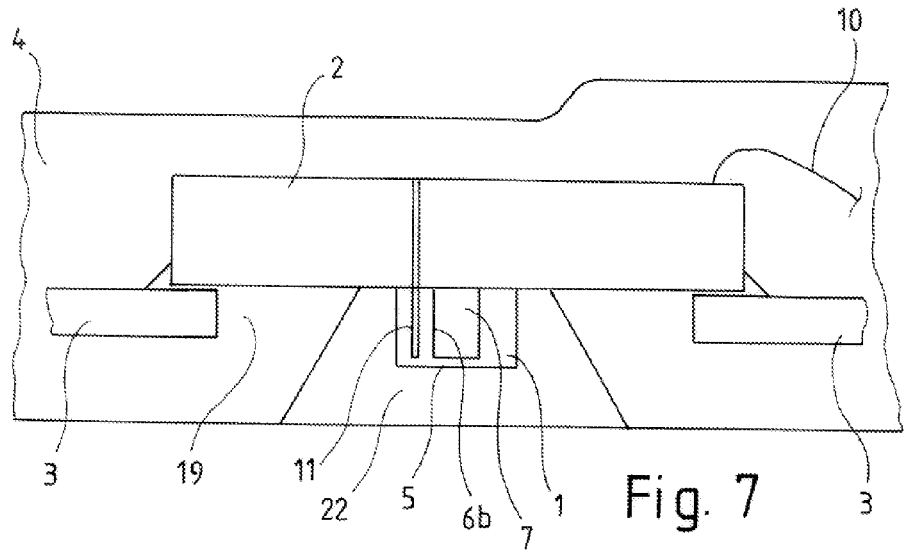
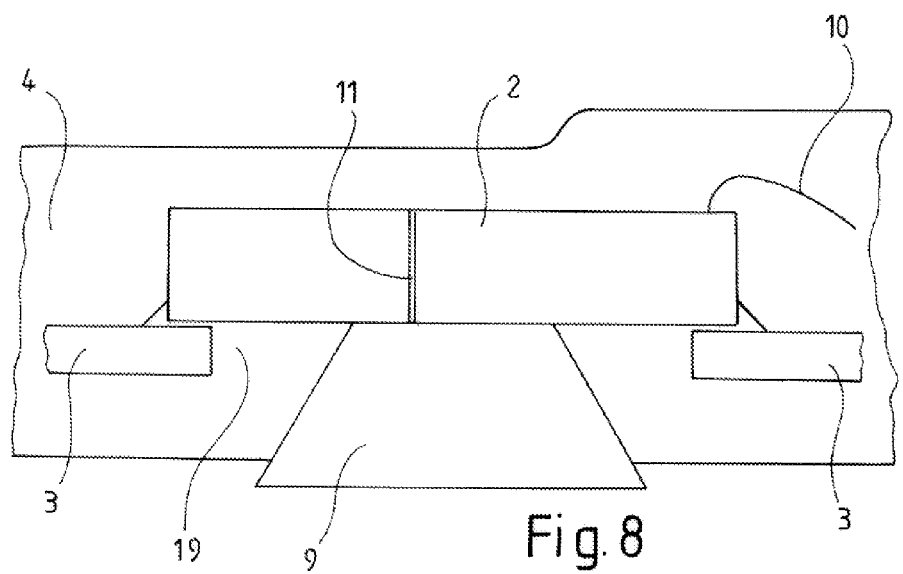

SENSOR MODULE FOR MEASURING A PRESSURE OF A FLUID WITH AT LEAST ONE ELECTRONIC CIRCUIT, PARTICULARLY AN INTEGRATED CIRCUIT, ARRANGED ON A CIRCUIT CARRIER, AND AT LEAST ONE PRESSURE MEASURING CHIP

The invention relates to a sensor module for measuring a pressure of a fluid, having at least one supporting element, with at least one electronic circuit, particularly an integrated circuit arranged on a circuit carrier, and with at least one pressure measuring chip that has at least one pressure measuring membrane, wherein at least sections of the circuit carrier are surrounded by a protective material to protect it from surrounding fluids.

Sensor modules for measuring media pressures, for example the fluid pressure of an oil or fuel, are used in many industrial applications, particularly in motor vehicles. Pressure sensor modules for measuring relative pressure consist of at least two elements, the pressure measuring chip with the pressure measuring membrane and a glass substrate, and modules for measuring absolute pressure include three elements, the pressure measuring chip with the pressure measuring membrane, the glass substrate and a glass element for creating a vacuum chamber. The signals generated by the pressure measuring chip are usually processed via an integrated circuit (ASIC), which may be arranged on a circuit carrier. The integrated circuit is arranged together with the other elements on a support element, a supporting stamped or printed circuit board, for example. Sensor modules also exist, in which the pressure measuring chip and the pressure measuring membrane are integrated monolithically, directly in the integrated circuit.

One method for method for monolithic integration of a pressure measuring chip in the integrated circuit is described in the document U.S. Pat. No. 8,101,469 B2.

Since the sensor modules are often used for measuring aggressive fluids such as oils or fuels, they must be wrapped in an protective material to protect them, for example a plastic, particularly a duroplast.

In order to guarantee that the pressure is measured correctly, the pressure measuring chip must be mechanically decoupled from the element that functions as the support, for example a stamped or printed circuit board, in order to minimise the transmission of vibrations or expansions. An element provided specifically for this purpose, a glass substrate for example, is typically used for this.

In addition, a further, mechanical source of stress can act on the stress-sensitive pressure measuring membrane due to moisture uptake by the duroplastic material. A mechanical coupling of the pressure measuring membrane and/or the pressure measuring chip with the surrounding protective material affects the accuracy of the measurement, because tensions may arise as a result of the hygroscopic behaviour of the surrounding protective material, which are then transmitted to the pressure measuring chip through the mechanical coupling, thereby creating an uncompensable measurement error.

The object underlying the invention is to provide a sensor module in which the pressure measuring chip is protected from influences by the surrounding protective material and the support elements.

In a sensor module for measuring a pressure of a fluid with at least one support element, at least one electronic circuit, particularly an integrated circuit, arranged on at least one circuit carrier and with at least one pressure measuring chip that includes at least one pressure measuring membrane, wherein at least sections of the circuit carrier are surrounded by a protective material as protection from surrounding fluids, it is provided as essential to the invention that the pressure measuring chip and the circuit carrier are arranged one on top of the other vertically, that the pressure measuring chip is mechanically decoupled from the support element, and that a side of pressure measuring chip having a recess has a media-impermeable connection to the circuit carrier on at least sections of an area surrounding said recess for the purpose of creating an isolated cavity between the pressure measuring membrane and the circuit carrier. In order to measure the pressure exactly, it is necessary to decouple the pressure measuring chip from a support element, for example a stamped or printed circuit board, a "lead frame" on which elements of the sensor module are mounted. The circuit carrier of the integrated circuit may be used for the decoupling instead of an element provided solely for this purpose, such as a glass substrate, example. To this end, the pressure measuring chip and the circuit carrier are arranged vertically one on top of the other, so that only the circuit carrier is in contact with the support element, and the pressure measuring chip is thus mechanically decoupled from the support element. For mechanical decoupling, the decoupled element, in this case the circuit carrier, must have a minimum thickness. This minimum thickness is satisfied for example by a standard silicon wafer, from which the circuit carrier may be produced. The process of abrasion, which is often carried out when silicon wafers are used, must only be performed until the minimum thickness is reached. The effect of the minimum thickness of the shielding element is to attenuate the mechanical influences transmitted to the pressure measuring chip, from the support element of the stamped circuit board, for example, so that it is possible to measure more accurately with systems that are not decoupled. The effect of the media-impermeable connection between the pressure measuring chip and the circuit carrier is that the cavity formed between the pressure measuring membrane and the circuit carrier is also closed off in media-impermeable manner. If the pressure measuring chip and the circuit carrier are connected under vacuum conditions, the cavity may contain a vacuum. This vacuum, which is located on one side of the pressure measuring membrane and serves as a reference volume, enables absolute pressure measurements to be carried out with the pressure sensor module. The formation of the vacuum reference chamber between the circuit carrier and the pressure measuring chip means that it is no longer necessary to arrange a body such as a glass body provided specifically to surround the vacuum chamber. This results in further cost savings, and enables an even more compact construction of the sensor module.

In a refinement of the invention, the pressure measuring chip is decoupled from the support element mechanically by the circuit carrier. Use of the circuit carrier as the decoupling element enables cost saving compared with the use of a glass substrate provided specifically for this purpose. The arrangement of the pressure measuring chip and the circuit carrier vertically one on top of the other also enables the sensor module to be constructed in a more compact manner.

In a refinement of the invention, at least sections of the pressure measuring chip are mechanically decoupled from the surrounding protective material. Moisture uptake or temperature influences, for example, can cause the surrounding protective material to expand or contract, leading to material stress. If this material stress is transmitted to the pressure measuring membrane, measuring inaccuracies may result. Mechanical decoupling, by means of an aperture in the surrounding protective material in the area of the pressure measuring membrane can prevent the material stress from being transmitted and thus reduce measuring inaccuracies.

In a further refinement of the invention, the pressure measuring membrane is formed by a recess on at least one side of the pressure measuring chip. The pressure measuring membrane of the pressure measuring chip may be produced by etching the chip from one or even both sides, for example. As the pressure measuring chip and the circuit carrier are arranged vertically one directly on top of the other, the pressure measuring membrane is arranged very closely to the surface of the circuit carrier. Consequently, material tensions in the surrounding protective material, which may be caused by the hygroscopic behaviour of the protective material, or temperature variations for example, are only transmitted to the pressure measuring membrane in a reduced form. The material stresses thus only cause a very slight additional deformation of the pressure measuring membrane, so that measuring errors may be reduced thereby. Furthermore, the maximum deflection of the membrane is restricted by its proximity to the upper side of the circuit carrier, so that the risk of damage due to excessive deflections at the membrane is limited.

In a refinement of the invention, the pressure measuring chip has relief joints for mechanically decoupling the pressure measuring membrane from the protective material that surrounds at least sections of the pressure measuring chip. The arrangement of the pressure measuring chip and the circuit carrier vertically one on top of the other results in a compact construction of the sensor module, so that the pressure measuring chip is surrounded by less protective material than in a less compact construction. This in turn has the effect of reducing the influence of material stresses in the surrounding material on the pressure measuring membrane. A further reduction is achieved with the arrangement of relief joints, which are preferably disposed beside the pressure measuring membrane in surface of the pressure measuring chip, on the side facing toward the fluid to be measured and away from the circuit carrier. In this configuration, the relief joints and the side of the pressure measuring membrane facing the fluid are preferably not surrounded by the protective material. Expansions in the protective material, due to temperature changes or hygroscopic effects for example, are prevented from being transmitted to the pressure measuring membrane by the compression of the hollow space in the relief joints. As a result, the pressure measuring membrane is exposed to a smaller pressure load, which thus reduces measuring errors due to the material properties of the protective material.

In a further refinement of the invention, the circuit carrier and the pressure measuring chip have an electrically conductive connection in the form of a silicon through-connection. An electrically conductive connection between the pressure measuring chip and the circuit carrier may be provided by a wire connection, for example a wire connection created by wire bonding. One option for creating a wireless electrical connection between the pressure measuring chip and the circuit carrier is contacting by means of a silicon through-connection. In this option, an electrical connection is routed through the silicon substrate of the pressure measuring chip for example. Such a contact using silicon through-connections supports the compact construction of the sensor module, because less surrounding protective material is need to wrap around the pressure measuring chip, as no wire connections need to be surrounded. The use of less protective material further means that the influence of the hygroscopic behaviour or thermal expansion of the protective material is also reduced.

In a further embodiment of the invention, the sensor module has an enveloping body, the enveloping body delimits at least sections of a cavity, and the enveloping body forms a barrier between the pressure measuring chip and the surrounding protective material at least in sections.

The enveloping body may be made from glass or another durable material for example. The enveloping body is arranged such that when the sensor module undergoes an overmoulding process with the surrounding protective material no protective material comes into contact with the pressure measuring chip. The pressure measuring chip, and particularly the pressure measuring membrane is thus shielded from surrounding protective material by the enveloping body. This barrier created by the enveloping body assures the total mechanical decoupling of the pressure measuring chip from the surrounding protective material. To this end, the enveloping body surrounds a cavity, or at least sections thereof, in which the pressure measuring chip is arranged.

In a further embodiment of the invention, at least sections of the enveloping body include a media-impermeable connection with the circuit carrier, at least sections of the pressure measuring chip include a media-impermeable connection with the circuit carrier, a closed cavity is formed between the enveloping body, the circuit carrier and the pressure measuring chip, one side of the pressure measuring membrane of the pressure measuring chip forms the boundary with the closed cavity and the other side thereof is adjacent to the fluid to be measured, and at least sections of the enveloping body are arranged between the pressure measuring chip and the surrounding protective material. In this embodiment, a reference pressure chamber for measuring absolute pressures is created due to the fact that the enveloping body has a recess, and is fastened to the circuit carrier by the side thereof on which the recess is formed in a vacuum atmosphere. The pressure measuring chip is arranged in the cavity thus formed between the enveloping body and the circuit carrier. Because the pressure measuring chip has a media-impermeable connection with the circuit carrier and the pressure measuring chip is surrounded by the enveloping body, a reference chamber with vacuum atmosphere is created between the pressure measuring chip, the circuit carrier and the enveloping body. The fluid to be measured may be fed to the pressure measuring membrane for example through a passthrough in the circuit carrier above which the pressure measuring membrane is located. This passthrough may be kept free for example by a space holding element during an overmoulding process for applying the surrounding protective material, which space holding element is removed again after the overmoulding process. In this embodiment, the enveloping body fulfils the dual purposes of decoupling the pressure measuring membrane from the surrounding protective material and forming the reference chamber.

In a variant of the invention, at least sections of the pressure measuring chip include a media-impermeable connection with the enveloping body, a closed cavity is formed between the pressure measuring chip and the enveloping body, one side of the pressure measuring membrane of the pressure measuring chip forms the boundary with the closed cavity and the other side thereof is adjacent to the fluid to be measured. The enveloping body is preferably arranged between the pressure measuring chip and the circuit carrier. For example, the enveloping body may have a cavity, the aperture of which is located on the side of the enveloping body facing away from the circuit carrier. The pressure measuring chip is accommodated in this cavity, so that the enveloping body surrounds the pressure measuring chip laterally. The inner wall of the enveloping body facing way from the aperture may be furnished with a recess that is covered by the pressure measuring chip, particularly the membrane of the pressure measuring chip. The recess is surrounded by a media-impermeable connection between the pressure measuring chip and the enveloping body. In this way, the pressure measuring chip and the enveloping body form a cavity in which a vacuum can be created when the pressure measuring chip and the enveloping body are connected in a vacuum atmosphere. The cavity thus formed serves as a reference volume when measuring absolute pressure. The fluid to be measured may pass through the aperture in the side of the enveloping body facing way from the circuit carrier, and thus reach the pressure measuring membrane. The aperture may be kept free for example by a space holding element during an overmoulding process for applying the surrounding protective material, which space holding element is removed again after the overmoulding process is complete.

In a further embodiment of the invention, the sensor module includes at least one enveloping body, at least sections of which are arranged between the pressure measuring chip and the surrounding protective material, wherein the enveloping body has at least one aperture so that the fluid to be measured can enter, and a closed cavity is formed between the pressure measuring chip and the circuit carrier. The pressure measuring chip preferably has a recess by which the pressure measuring membrane is formed. In the areas surrounding the recess, the pressure measuring chip has a media-impermeable connection with the circuit carrier, so that a closed cavity is formed between the pressure measuring chip and the circuit carrier, and may serve as a reference volume for absolute pressure measurements, for example. In this embodiment, the enveloping body merely serves to keep the surrounding protective material at a distance from the pressure measuring chip and thus ensure that the pressure measuring chip is mechanically decoupled from the protective material. For this purpose, the enveloping body may be arranged on the circuit carrier in such manner that is surrounds the pressure measuring chip. For example, the enveloping body may have walls arranged vertically to the circuit carrier, or horizontally and vertically to the circuit carrier. The enveloping body is furnished with at least one aperture, through which the medium to be measured is able to reach the pressure measuring chip. The aperture may be kept free for example by a space holding element, particularly a punch during the overmoulding process with the protective material.

In a further embodiment of the invention, at least sections of the pressure measuring chip and the circuit carrier include a media-impermeable connection, a closed cavity is formed between the pressure measuring chip and the circuit carrier, at least sections of the side of the circuit carrier facing the pressure measuring chip have a connection to a support element, the support element has a cutout that surrounds at least sections of the pressure measuring chip, and the surrounding protection material has a cutout surrounds the pressure measuring chip, allowing the fluid to be measured to pass through. The sensor module has a support element, for further assembly options, for example, on which the circuit carrier is mounted. The support element may be a stamped circuit board, a "lead frame", for example. The stamped circuit board has a cutout that is used for mounting circuit carrier, for example in such manner that the circuit carrier lies on the borders of the cutout. The pressure measuring chip may be mounted on the side of the circuit carrier facing towards the stamped circuit board. Then, the borders of the cutout in the stamped circuit board surround the pressure measuring chip. The pressure measuring chip as a recess for forming the pressure measuring membrane. A media-impermeable connection between the pressure measuring chip and the circuit carrier exists in the area surrounding the recess, so that a cavity is created between the circuit carrier and the pressure measuring chip for forming a reference volume. The arrangement of the pressure measuring chip on the circuit carrier with no contact between the pressure measuring chip and other components has the effect of mechanically decoupling the pressure measuring chip from the stamped circuit board, for example. The transmission of mechanical loads on the stamped circuit board to the pressure measuring chip is thus very limited, thereby ensuring more accurate pressure measurement. In order to decouple the pressure measuring chip from the surrounding protection material, the protection material has a cutout in which the pressure measuring chip is mounted on the circuit carriers. In this way, decoupling of the pressure measuring chip is assured, and the fluid to be measured can reach the membrane of the pressure measuring chip. This arrangement of stamped circuit board, circuit carrier and surrounding protective material also enables subsequent mounting of the pressure measuring chip on the sensor module. This enables the pressure measuring chip to be replaced, for example, while the circuit carrier and the other components in a unit are retained. A particularly compact construction of the sensor is created if the pressure measuring chip is secured through a cutout in the stamped circuit board, with the result that the height of the sensor is minimal.

In a further embodiment of the invention, at least sections of the circuit carrier and the support element have a media-impermeable connection, the support element has a recess, the recess is surrounded by the areas the support element and the circuit carrier with the media-impermeable connections, the circuit carrier has a media-impermeable connection with the pressure measuring chip, the circuit carrier has an aperture, one side of which is sealed by the pressure measuring chip, and the pressure measuring chip is arranged between the recess in the support element and the circuit carrier, so that a closed cavity is formed between the support element, the pressure measuring chip and the circuit carrier. The support element is preferably a stamped circuit board, and the recess in the stamped circuit board is in the form of a depression. For example, the circuit carrier may cover the depression in the stamped circuit board in such manner that the circuit carrier rests on the borders surrounding the depression. The circuit carrier and the stamped circuit board preferably form a media-impermeable connection on these areas. The circuit carrier includes an aperture that is preferably arranged in the middle of the area between the bearing surfaces on the stamped circuit board. The pressure measuring chip is arranged on the side of the circuit carrier facing the stamped circuit board in such manner that it covers the aperture in the circuit carrier. In particular, the pressure measuring chip and the circuit carrier have a media-impermeable on the areas surrounding the aperture. The pressure measuring chip has a pressure measuring membrane that is preferably arranged below the aperture in the circuit carrier. A cavity is formed between the pressure measuring chip, the circuit carrier and the stamped circuit board by the media-impermeable connections between the stamped circuit board and the circuit carrier and between the circuit carrier and the pressure measuring chip, which cavity may serve particularly as a reference volume for absolute pressure measurements. The fluid to be measured is able to reach the pressure measuring membrane through the aperture in the circuit carrier.

In a further variation of the invention, the surrounding protective material has a cutout, and the cutout surrounds the aperture in the circuit carrier. The aperture is kept free for example by a space holding element, particularly a punch during the overmoulding process with the surrounding protective material. The fluid to be measured can pass through the aperture in the circuit carrier to reach the pressure measuring membrane.

In a method for producing a sensor module having at least one circuit carrier, at least one pressure measuring chip and a protective material that surrounds at least sections of the circuit carrier and the pressure measuring chip, it is it is provided as essential to the invention that the protective material is applied in an overmoulding process, and that areas are kept free from the protective material by the placement of space holding elements before the overmoulding process is carried out. In order to protect the pressure sensor from aggressive media, such as fuels, at least sections of the pressure sensor are encased in a protective material, a duroplast for example. In this context an overmoulding process in preferably used in which the protective material is sprayed of the areas that are to be protected. Areas that must not be surrounded by a protective material, such as passthrough apertures in the circuit carrier, may be provided with a space holding element prior to the overmoulding process, so that these areas remain free of the protective material during the overmoulding process. After the overmoulding process is completed, the space holding elements are removed.

In a variation of the method, at least on element of the sensor module is mounted in at least one area that has been kept free of protective material after the overmoulding process. For example, the area on the circuit carrier on which the pressure measuring chip is mounted, is kept free by a space holding element, for example a punch. A further component, the pressure measuring chip for example, may then be mounted in this reserved area subsequently, after the overmoulding process has been completed. This subsequent mounting capability enables a modular assembly approach, wherein the sensor modules can be adapted for various ambient conditions for example by appropriate selection of various pressure measuring chips with different pressure measuring membranes. The unit consisting of the stamped circuit board and the circuit carrier does not need to be changed further.

Figure 6:
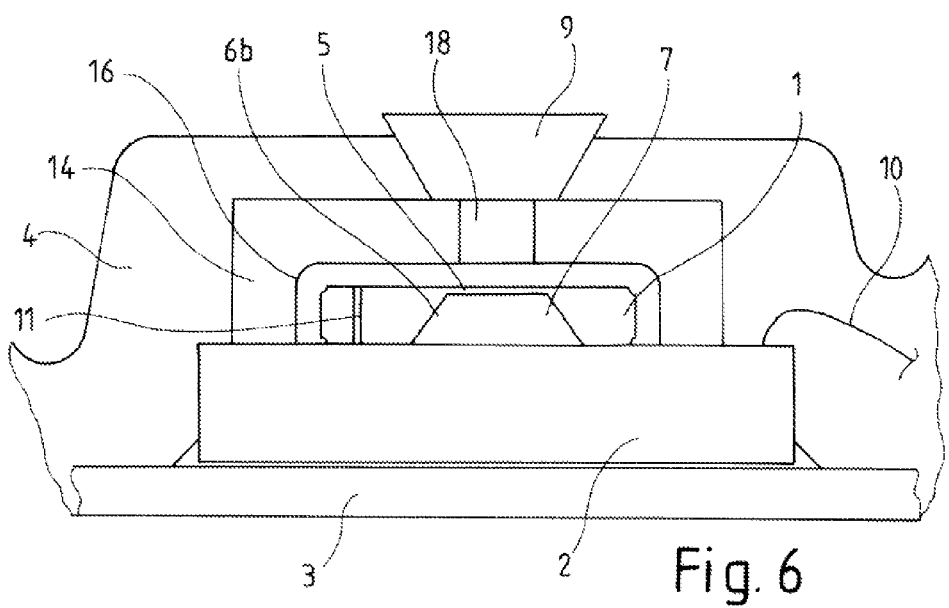
Figure 9:
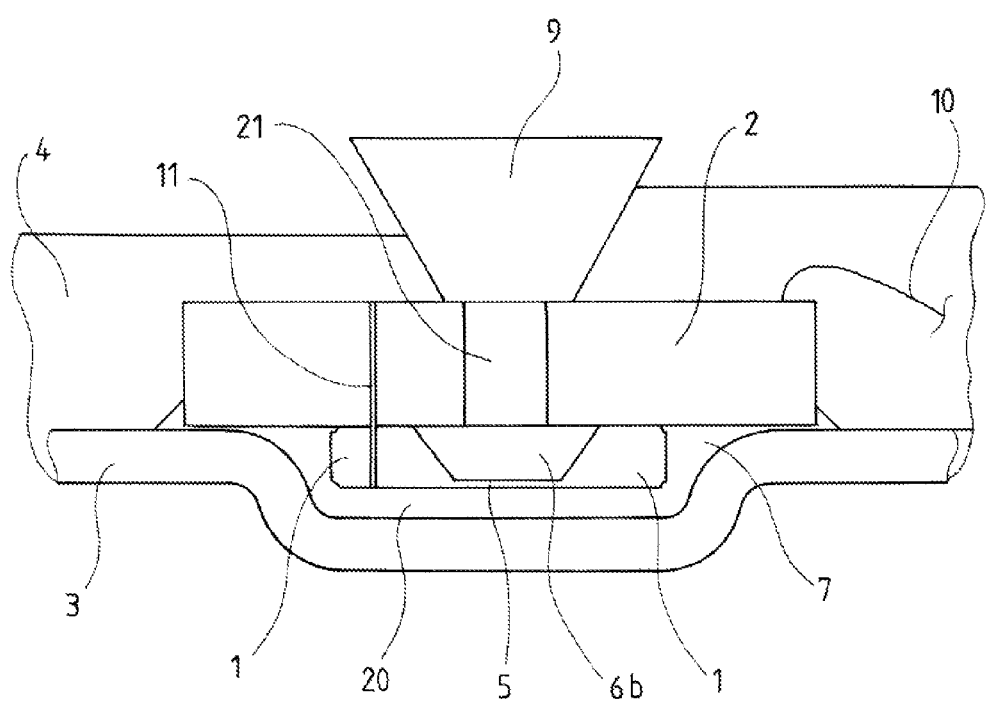

Exemplary embodiments of the invention, illustrating further inventive features, are represented in the figures of the drawing. In the drawing:

FIG. 1: is a schematic, partial cutaway view of the sensor module with a pressure measuring chip having relief joints and a wire connection between the pressure measuring chip and the circuit carrier;

FIG. 2: is a schematic, partial cutaway view of a sensor module according to FIG. 1 with a silicon through-connection;

FIG. 3: is a schematic, partial cutaway view of a sensor module with an enveloping body and a circuit carrier with an aperture;

FIG. 4: is a schematic, partial cutaway view of a sensor module with an enveloping body arranged between a circuit carrier and a pressure measuring chip;

FIG. 5: is a schematic, partial cutaway view of a sensor module with an enveloping body surrounding the pressure measuring chip;

FIG. 6: is a schematic, partial cutaway view of a sensor module with an enveloping body furnished with an aperture;

FIG. 7: is a schematic, partial cutaway view of a sensor module with a support element having a cutout and a pressure measuring chip arranged in the cutout;

FIG. 8: is a schematic, partial cutaway view of a sensor module with a space holding element; and FIG. 9: is a schematic, partial cutaway view of a sensor module with a support element having a depression.

FIG. 1 shows a sensor module with a pressure measuring chip 1, a circuit carrier 2, a support element 3 and a surrounding protective material 4. Pressure measuring chip 1 includes a pressure measuring membrane 5, which is formed by two recesses 6a, 6b. Recesses 6a, 6b are preferably created in an etching process. Pressure measuring chip 1 and circuit carrier 2 are arranged vertically one on top of the other and have a media-impermeable connection in the area surrounding recess 6b. Recess 6b and the surface of circuit carrier 2 thus form a closed cavity 7 which may serve as a vacuum reference volume when pressure measuring chip 1 and circuit carrier 2 are joined under vacuum conditions. Sections of pressure measuring chip 1, circuit carrier 2 and support element 3 are surrounded by the protective material 4. The protective material 4 is a plastic, for example, particularly a duroplast, which protects the sensor module from aggressive media such as fuels. Because of its hygroscopic behaviour or expanding or contracting response to temperature changes, the duroplastic protective material 4 can transmit a material stress to pressure measuring membrane 5, which in turn can distort the results of the pressure measurement. Since pressure measuring membrane 5 is produced in an etching process, pressure measuring membrane 5 rests very closely on the surface of circuit carrier 2, which has the effect of reducing the influence of the material stress from the protective material 4. Pressure measuring chip 1 is also furnished with relief joints 8, arranged on side thereof facing away from circuit carrier 2. Due to relief joints 8, the material stress transmitted from the protective material 4 to pressure measuring membrane 5 is attenuated. For example, if the protective material 4 expands due to heat, the corresponding relief joint 8 is pressed together, and the expansion of pressure measuring chip 1 is absorbed before it reaches pressure measuring membrane 5. The protective material 4 has a cutout in the area of pressure measuring membrane 5, in order to enable contact between the fluid to be measured and pressure measuring membrane 5, and in order to reduce the transmission of material stress from the protective material 4 to pressure measuring membrane 5. Cutout in the protective material 4 is created during the overmoulding process with a space holding element 9, for example a punch. Pressure measuring chip 1 is connected to circuit carrier 2 with a signal-conducting wire contact 10. Circuit carrier 2 in turn is connected to via a wire contact 10 to component for further processing, a signal node, for example.

FIG. 2 shows a sensor module according to FIG. 1. Identical elements are identified with the same reference signs. Unlike the embodiment in FIG. 1, pressure measuring chip 1 is connected to circuit carrier 2 via a silicon through-connection 11. Silicon through-connection 11 enables an even more compact construction, which means that less protective material 4 is needed to surround the sensor module. In this way, the influence of material stress on pressure measuring membrane 5 is reduced further still.

FIG. 3 shows a sensor module with a pressure measuring chip 1, a circuit carrier 2 and a support element 3, which may be in the form of a stamped circuit board. Pressure measuring chip 1 is arranged on the side of circuit carrier 2 facing away from stamped circuit board 3. Pressure measuring chip 1 has a recess 6b for creating pressure measuring membrane 5. This one-sided recess 6b is arranged above an aperture 12 in circuit carrier 2. Pressure measuring chip 1 and circuit carrier 2 have a media-impermeable connection in the areas around aperture 12. Stamped circuit board 3 has an aperture 13 that is arranged below aperture 12 in circuit carrier 2. Apertures 12 and 13 allow the fluid that is to be measured to pass through and come into contact with pressure measuring membrane 5. Pressure measuring chip 1 is surrounded by an enveloping body 14, the contact surfaces of which are furnished with media-impermeable connections with circuit carrier 2. A closed cavity 7 is formed between circuit carrier 2, pressure measuring chip 1 and enveloping body 14, and may be used as a vacuum reference volume when measuring absolute pressure, if the unit consisting of pressure measuring chip 1 and circuit carrier 2 is joined with enveloping body 14 under vacuum conditions. Pressure measuring chip 1 is connected to circuit carrier 2 via a silicon through-connection 11. Enveloping body 14 surrounds pressure measuring chip 1 in such manner that the surrounding protective material 4 does not come into contact with pressure measuring chip 1, and consequently no material stress can be transmitted to pressure measuring chip 1.

FIG. 4 shows an embodiment of the invention in which enveloping body 14 is arranged between pressure measuring chip 1 and circuit carrier 2. Enveloping body 14 may preferably be a glass body. Enveloping body 14 has a recess 15, above which pressure measuring chip 1 is arranged. A media-impermeable connection exists in the contact areas between pressure measuring chip 1 and enveloping body 14. The depression-like recess 15 forms a closed cavity 7 in enveloping body 14, which cavity may be used as a reference volume for absolute pressure measurements. Closed cavity 7 may contain a vacuum if pressure measuring chip 1 and enveloping body 14 are joined with each other under vacuum conditions. Enveloping body 14 not only serves to form this reference volume, its walls 16 also protect pressure measuring chip 1 from the surrounding protective material 4. An aperture 17 is formed in the side of enveloping body 14 facing away from circuit carrier 2, and the fluid to be measured passes through this aperture to contact pressure measuring membrane 5. Aperture 17 is kept free of protective material 4 during the overmoulding process for applying the protective material 4 by the use of a space holding element 9.

FIG. 5 shows an embodiment of the sensor module in which enveloping body 14 fulfils only a protecting function for pressure measuring chip 1. Pressure measuring chip 1 is arranged on circuit carrier 2 and has a recess 6b that may serve as a reference volume for absolute pressure measurements if pressure measuring chip 1 and circuit carrier 2 are joined under vacuum conditions and have media-impermeable connections on the contact surfaces thereof. Enveloping body 14 has an aperture 17 through which the fluid to be measured may come into contact with pressure measuring membrane 5. Enveloping body 14 is preferably made from glass or a similar durable material, and encloses pressure measuring chip 1 laterally, so that pressure measuring membrane 5 is mechanically decoupled from the surrounding protective material 4, and pressure measuring chip 1 is thus protected from possible material stress in the surrounding protective material 4. Aperture 17 of enveloping body 14 is kept free during the overmoulding process by a space holding element 9. Alternatively, enveloping body 14 may be dispensed with entirely if space holding element 9 is conformed such that it surrounds pressure measuring chip 1 and thus keeps pressure measuring chip 1 free from the protective material 4 during the overmoulding process.

FIG. 6 shows a sensor module according to FIG. 5, with the difference that enveloping body 14 has walls 16 that are arranged vertically to the surface of circuit carrier 2 and also sections that extend horizontally to the surface of circuit carrier 2. Enveloping body 14 only has one small aperture 18, through which the fluid to be measured is able to come into contact with pressure measuring membrane 5. Because of the smaller size of entry hole 18, pressure measuring chip 1 is very well protected from external influences, such as particles swept along in the stream of the fluid to be measured. A space holding element 9 is used to keep entry hole 18 free during the overmoulding process.

FIG. 7 shows an alternative embodiment of the invention, in which support element 3, in the form of a stamped circuit board for example, has a cutout 19 in which pressure measuring chip 1 is mounted. Circuit carrier 2 is mounted above cutout 19, so that circuit carrier 2 rests on the borders of cutout 19 of stamped circuit board 3. Pressure measuring chip 1 is mounted on the side of circuit carrier 2 facing towards cutout 19, and pressure measuring chip 1 and circuit carrier 2 between themselves form a closed cavity 7, which may serve as a reference volume for absolute pressure measurements. The surrounding protective material 4 has a cutout 22 in the area of pressure measuring chip 1. If pressure measuring chip 1 is arranged inside cutout 19, a very compact construction of the sensor module is obtained. In addition, pressure measuring chip 1 is very effectively decoupled mechanically from the influences of stamped circuit board 3 and the surrounding protective material 4. This kind of arrangement makes is possible to remove pressure measuring chip 1 from a finished module, for example, and to replace it with a differently configured pressure measuring chip 1, for example, so that the sensor can be adapted to reflect different external conditions.

FIG. 8 shows a sensor module according to FIG. 7 after the overmoulding process and before pressure measuring chip 1 is mounted. Cutout 22 in the protective material 4 is kept free by a space holding element 9. After the space holding element 9 has been removed, pressure measuring chip 1 is mounted in cutout 22. This method, in which the wrapping in protective material 4 takes place before the pressure measuring chip 1 is mounted, enables a kind of modular construction approach, in which different pressure measuring chips 1 can be mounted on units consisting of a circuit carrier 2 and stamped circuit board 3.

FIG. 9 shows an alternative embodiment of the invention, in which support element 3 has a recess 20. Circuit carrier 2 is thus arranged above the depression-like recess 20 in such manner that it rests on the borders of recess 20. Pressure measuring chip 1 is mounted on circuit carrier 2 between circuit carrier 2 and recess 20. In this context, pressure measuring membrane 5 of pressure measuring chip 1 is arranged below a passthrough aperture 21 in circuit carrier 2. The fluid to be measured is able to pass through the passthrough aperture 21 in circuit carrier 2 and come into contact with pressure measuring membrane 5. Circuit carrier 2 has media-impermeable connections at its connection sites with support element 3 and at its connection sites with pressure measuring chip 1, so that a closed cavity 7 is formed between recess 20, circuit carrier 2 and pressure measuring chip 1, and may serve as a reference volume for an absolute pressure measurement if the elements are joined together under vacuum conditions. If pressure measuring chip 1 is arranged inside recess 20 pressure measuring chip 1 is mechanically decoupled from the surrounding protective material 4 and the influences of stamped circuit board 3. The sensor module with this arrangement can be constructed in particularly compact form. Passthrough aperture 21 is covered with a space holding element 9 during the overmoulding process with protective material 4, so that passthrough 21 is kept free of protective material 4.

All of the features described in the preceding description and in the claims can be combined freely with the features of the independent claim. The disclosure of the invention is thus not limited to the combinations of features that are described and claimed, but all practicable feature combinations are rather to be considered disclosed within the scope of the present invention.

The invention claimed is:

1. A sensor module for measuring a pressure of a fluid, having at least one supporting element, at least one electronic circuit, particularly an integrated circuit, arranged on at least one circuit carrier, and with at least one pressure measuring chip that has at least one pressure measuring membrane, wherein at least sections of the circuit carrier are surrounded by a protective material to protect the circuit carrier from surrounding fluids,
   wherein
   the pressure measuring chip and the circuit carrier are arranged vertically one underneath the other,
   the pressure measuring chip is at least partially mechanically decoupled from the supporting element,
   a side of pressure measuring chip having a recess has a media-impermeable connection to the circuit carrier on at least sections of an area surrounding said recess for the purpose of creating a closed cavity between the pressure measuring membrane and the circuit carrier; and
   the pressure measuring chip is mechanically decoupled from the support element by the circuit carrier.

2. The sensor module according to claim 1, wherein at least sections of the pressure measuring chip are mechanically decoupled from the surrounding protective material.

3. The sensor module according to claim 1, wherein the pressure measuring membrane is formed by a recess on at least one side of the pressure measuring chip.

4. A sensor module for measuring a pressure of a fluid, having at least one supporting element, at least one electronic circuit, particularly an integrated circuit, arranged on at least one circuit carrier, and with at least one pressure measuring chip that has at least one pressure measuring membrane, wherein at least sections of the circuit carrier are surrounded by a protective material to protect the circuit carrier from surrounding fluids,
   wherein
   the pressure measuring chip and the circuit carrier are arranged vertically one underneath the other,
   the pressure measuring chip is at least partially mechanically decoupled from the supporting element,
   a side of pressure measuring chip having a recess has a media-impermeable connection to the circuit carrier on at least sections of an area surrounding said recess for the purpose of creating a closed cavity between the pressure measuring membrane and the circuit carrier; and
   the pressure measuring chip has relief joints for mechanically decoupling the pressure measuring membrane from the protective material that surrounds at least sections of the pressure measuring chip.

5. A sensor module for measuring a pressure of a fluid, having at least one supporting element, at least one electronic circuit, particularly an integrated circuit, arranged on at least one circuit carrier, and with at least one pressure measuring chip that has at least one pressure measuring membrane, wherein at least sections of the circuit carrier are surrounded by a protective material to protect the circuit carrier from surrounding fluids,
   wherein
   the pressure measuring chip and the circuit carrier are arranged vertically one underneath the other,
   the pressure measuring chip is at least partially mechanically decoupled from the supporting element,
   a side of pressure measuring chip having a recess has a media-impermeable connection to the circuit carrier on at least sections of an area surrounding said recess for the purpose of creating a closed cavity between the pressure measuring membrane and the circuit carrier; and
   the circuit carrier and the pressure measuring chip have an electrically conductive connection in the form of a silicon through-contact.

6. A sensor module for measuring a pressure of a fluid, having at least one supporting element, at least one electronic circuit, particularly an integrated circuit, arranged on at least one circuit carrier, and with at least one pressure measuring chip that has at least one pressure measuring membrane, wherein at least sections of the circuit carrier are surrounded by a protective material to protect the circuit carrier from surrounding fluids,
   wherein
   the pressure measuring chip and the circuit carrier are arranged vertically one underneath the other,
   the pressure measuring chip is at least partially mechanically decoupled from the supporting element,
   a side of pressure measuring chip having a recess has a media-impermeable connection to the circuit carrier on at least sections of an area surrounding said recess for the purpose of creating a closed cavity between the pressure measuring membrane and the circuit carrier;
   the sensor module has an enveloping body, at least sections of the enveloping body delimit a cavity, and that at least sections of the enveloping body form a barrier between the pressure measuring chip and the surrounding protective material; and
   at least sections of the pressure measuring chip have a media-impermeable connection with the enveloping body, a closed cavity is formed between the pressure measuring chip and the protective material, one side of the pressure measuring membrane of the pressure measuring chip delimits the closed cavity and the other side thereof is adjacent to the fluid to be measured.

7. The sensor module according to claim 6, wherein at least sections of the enveloping body have a media-impermeable connection with the circuit carrier, at least sections of the pressure measuring chip have a media-impermeable connection with the circuit carrier, and at least sections of the enveloping body are arranged between the pressure measuring chip and the surrounding protective material.

8. The sensor module according to claim 6, wherein the enveloping body has at least one aperture to allow entry by the fluid to be measured, and a closed cavity is formed between the pressure measuring chip and the circuit carrier.

* * * * *